United States Patent [19]
Yanagihara et al.

[11] Patent Number: 4,910,041
[45] Date of Patent: Mar. 20, 1990

[54] FILM FORMATION PROCESS

[75] Inventors: Kenji Yanagihara, Abiko; Mituo Kimura; Hitoshi Chawanya, both of Yokohama; Koshi Numata, Kawasaki, all of Japan

[73] Assignee: Japan Synthetic Rubber Co., Ltd., Tokyo, Japan

[21] Appl. No.: 242,263

[22] Filed: Sep. 9, 1988

[30] Foreign Application Priority Data

Sep. 11, 1987 [JP] Japan .................. 62-227910
Oct. 23, 1987 [JP] Japan .................. 62-267768

[51] Int. Cl.$^4$ .............................................. B05D 3/06
[52] U.S. Cl. ...................................... 427/37; 427/38; 427/39; 427/45.1; 427/47
[58] Field of Search .................. 427/45.1, 37, 38, 39, 427/47

[56] References Cited

U.S. PATENT DOCUMENTS 4,816,113  3/1989  Yamazaki .................. 427/45.1

Primary Examiner—Bernard Pianalto
Attorney, Agent, or Firm—Oblon, Spivak, McClelland, Maier & Neustadt

[57] ABSTRACT

A process of forming a film on a substrate, which comprises bringing a substrate into contact with a plasma zone formed by generating, by use of a discharge electrode or discharge electrodes, high temperature or quasi-high temperature plasma of a gas containing at least one carbon containing compound, wherein said electrode comprises a sheet-like electrode provided with a slit having a linear portion and connected to a microwave electric source; or wherein said plasma zone is formed by forcing a high temperature or quasi-high temperature plasma generated in an arc between said electrodes by DC discharge, to move by applying a magnetic field. The process enables formation of films on substrate surfaces in a high energy efficiency.

22 Claims, 11 Drawing Sheets

FILM FORMATION PROCESS

BACKGROUND OF THE INVENTION

1. Field of the Invention

This invention relates to a process of forming a plasma polymerized film on a substrate surface by using a plasma of an organic compound gas, or a process of forming a film on a substrate surface by using an inorganic compound gas, as exemplified by plasma CVD. More particularly. it is concerned with a film formation process that can form the above every sort of film on a substrate in a high energy efficiency and is particularly suited for forming a film comprising a diamond-like substance.

2. Description of the Prior Art

Hitherto utilized in forming films by using every sort of plasma are methods in which parallel plate electrodes, hollow cathode cylindrical electrodes (which are for use in direct current, low frequency or high-frequency electric sources), coils (for use in high-frequency electric sources), microwave cavities (for use in microwave electric sources) or the like are used to generate plasma.

Such conventional methods of forming films by using plasma, however, can not treat substrate surfaces having a relatively large area. and moreover these methods have the problem that they can achieve only a low energy efficiency.

More specifically, when, for example, the microwave cavities are used, the plasma that can be generated has inherently such a small volume that they are not suited for treating surfaces having a large area. Other plasma generating systems enable generation of plasma with a large volume. Since, however, only part of the plasma that comes into contact with the substrate, can substantially contribute to the formation of films on substrate surfaces, it often occurs that almost all part of the large volume plasma plays no part in the formation of films, resulting in a low energy efficiency. In particular, in instances in which the formation of films is carried out in a high-temperature plasma zone, the plasma has such a high energy density that making plasma having a large volume may bring about a remarkable increase in consumption of the electric power necessary for excitation. Thus, this is a great problem in practical viewpoints.

In particular, films comprising a diamond-like substance are expected to be put into practical use as diamond tools such as throw-away tips and saws, all sorts of sliding parts, heat dissipation plates used in devices such as semiconductor lasers, IC packages and hybrid ICs, etc. For that purpose, however, it is strongly required to make it possible to prepare a diamond-like substance having a large area, and to improve productivity and enhance economical merits. However, in the above conventional method utilizing microwave plasma, the plasma that can be generated has inherently a small volume since there is used a microwave cavity. Hence, a film obtainable by making treatment once can have only a film area as small as several square centimeters, and can be applied with difficulty when substrates have a large substrate surface as in large tools, large machine parts, etc. Also, even when the substrates to be treated are of small size, it is impossible to treat a large number of substrates in one time, bringing about the problem that there can be achieved low productivity and economical merits. Moreover, an attempt to make large the microwave cavity may result in a lowering of energy absorption efficiency, making it impossible to generate a high temperature plasma necessary for the formation of films.

SUMMARY OF THE INVENTION

Accordingly, an object of this invention is to provide a process that can form every sort of film in a high energy efficiency.

As a means for achieving the above object, this invention provides a process of forming a film on a substrate, comprising;

bringing a substrate into contact with a plasma zone formed by generating by use of a discharge electrode a high temperature or quasi-high temperature plasma of a gas containing at least one selected from the group consisting of an organic compound and an inorganic compound;

wherein said electrode comprises a sheet-like electrode provided with a slit having a linear portion and connected to a microwave electric source (hereinafter called "the first process").

As another means for achieving the above object, this invention also provides a process of forming a film on a substrate, comprising:

bringing a substrate into contact with a plasma zone formed by generating by use of discharge electrodes, a high temperature or quasi-high temperature plasma of a gas containing at least one selected from the group consisting of an organic compound and an inorganic compound;

wherein said plasma zone is formed by forcing a high temperature or quasi-high temperature plasma generated in the form of an arc between said electrodes by DC discharge, to move by applying a magnetic field (hereinafter called "the second process").

The above processes of this invention enables formation of films on substrate surfaces in a high energy efficiency. In particular, the first process enables formation of films in a high energy efficiency, on substrate surfaces having a large area, and the second process enables formation of films in a large film formation rate and with a uniform thickness even with use of a relatively low energy.

DETAILED DESCRIPTION OF THE PREFERRED EMBODIMENTS

Figure 1:
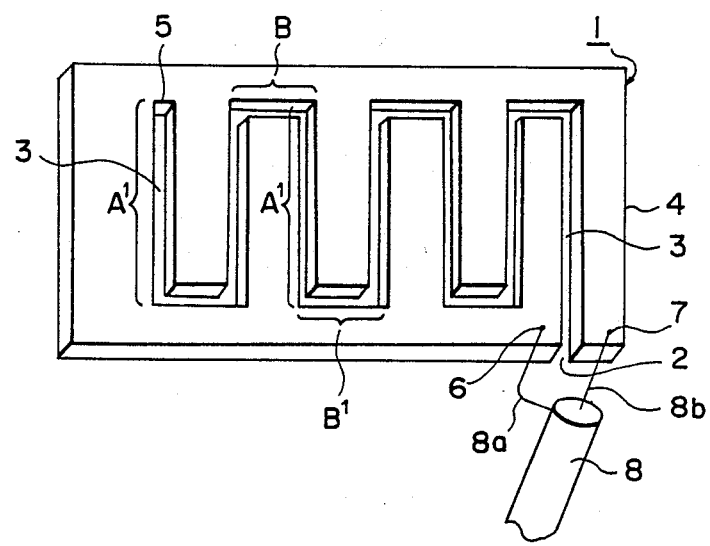
FIG. 1 and FIG. 2 are perspective views illustrating examples of the sheet-like electrode used in the first process of this invention.

Of the compounds usable as a component of the gas subjected to the electrical discharge in the first process and second process of this invention, the organic compound may include, for example, chain or cyclic saturated hydrocarbons such as methane, ethane, propane, butane, pentane, octane and cyclohexane; unsaturated hydrocarbons containing a double bond or triple bond, such as ethylene, propylene, butadiene, benzene, styrene, acetylene and allene; halogenated alkanes such as monofluoromethane, difluoromethane, trifluoromethane, tetrafluoromethane, monochloromethane, dichloromethane, trichloromethane, tetrachloromethane, monofluorodichloromethane, monofluoroethane, trifluoroethane, tetrafluoroethane, pentafluoroethane, hexafluoroethane, dichloroethane, tetrachloroethane, hexachloroethane, difluorodichloroethane, trifluorotrichloroethane, monofluoropropane, trifluoropropane, pentafluoropropane, perfluoropropane, dichloropropane, tetrachloropropane, hexachloropropane, perchloropropane, difluorodichlropropane, tetrafluorodichloropropane, bromomethane, methylene bromide, bromoform, carbon tetrabromide, tetrabromoethane, pentabromoethane, methyl iodide, diiodomethane, monofluorobutane, trifluorobutane, tetrafluorobutane, octafluorobutane, difluorobutane, monofluoropentane, pentafluoropentane, octachloropentane, perchloropentane, trifluorotrichloropentane, tetrafluorohexane, nonachlorohexane, pentafluorotrichlorohexane, tetrafluoroheptane, hexafluoroheptane, trifluoropentachloroheptane, difluorooctane, pentafluorooctane, difluorotetrafluorooctane, monofluorononane, hexafluorononane, decachlorononane, heptafluorohexachlorononane, difluorodecane, pentafluoodecane, tetrachlorodecane, tetrafluorotetrachlorodecane and octadecachlorodecane; nitrogen-containing organic compounds such as allylamine, methylamine, ethylamine, pyidine, pyrimidine, purine, picoline and acrylamide; sulfur-containing organic compounds such as carbon disulfide, methyl mercaptan and ethyl mercaptan; alcohols such as methanol, ethanol, propanol; phenol compounds such as phenol and crezole; aldehyde compounds such as holmaldehyde and acetaldehyde; ketone compounds such as acetone and methyl ethyl ketone; and fatty acids such as formic acid, acetic acid and propionic acid; alkyl esters such as methyl ester, ethyl ester and butyl ester of these fatty acids: etc.

The inorganic compounds usable in the first process and second process of this invention may include carbon monoxide, carbon dioxide and diazomethane.

The gases of these organic compounds and inorganic compounds may also be mixed with rare gases such as helium, argon and xenon or gases such as hydrogen, oxygen and nitrogen. These gases may be used alone or in combination of two or more.

To prepare the film comprising a diamond-like substance according to the first and second processes of this invention, used are carbon-containing organic compounds among the above, but preferred are carbon-containing organic compounds having 1 to 4 carbon atoms, such as methane, ethane, propane, butane, ethylene, propylene, butadiene, allylamine, methylamine, ethylamine, carbon disulfide, methanol, ethanol, formaldehyde and acetaldehyde, methyl ethyl ketone, formic acid, ethyl acetate, etc.

To prepare the film comprising a diamond-like substance, it is also required to mix hydrogen into the carbon-containing organic compounds, where hydrogen and carbon-containing organic compounds may preferably be used in the proportion of from 0.1 to 5 mol, more preferably from 0.2 to 2 mol, of carbon-containing organic compounds per 100 mol of hydrogen. Here, an overly small proportion of the carbon-containing organic compound tends to make slow the growth rate of the diamond like substance, and an overly large proportion of the same tends to result in formation of a diamond-like substance containing amorphous carbon in a large quantity.

In the processes of this invention, the high temperature or quasi-high temperature plasma is used. Here, the high temperature plasma is known to refer to a plasma of $Te/Tg \simeq 1$, assuming the electron temperature of plasma as Te and the gas temperature as Tg. The quasi-high temperature plasma is known to refer to a plasma of $1 < Te/Tg < 10$.

In the first process, used as the discharge electrode is a sheet-like electrode provided with a slit having a linear portion and connected to a microwave electric source (hereinafter referred to merely as "sheet-like electrode").

The slit provided in the sheet like electrode may have a turned shape, or may be partly turned drawing an arc, but has at least one substantially linear portion satisfying the condition expressed by the equation:

$$1 = n \times \lambda/2$$

wherein 1 is the length of said linear portion and is a wavelength of a microwave, and n is an integer of 1 or more, preferably 1 to 8, and more preferably 1 to 4 (hereinafter called "effective linear portion"). Absence of the effective linear portion in the slit may result in no normal microwave discharge, making it impossible to excite plasma in a desired state.

This slit may further preferably be provided in such a manner that the whole length of the effective linear portions may be 0.1 to 6 cm/cm$^2$ with respect to the area of the substrate surface on which a film is intended to be formed or the area of the sheet-like electrode.

The slit usually have a width of generally not less than 1 mm and less than $\lambda/2$.

FIG. 1 is a perspective view illustrating an example of the sheet-like electrode, in which a sheet-like electrode has a slit formed by making a out from an outer edge into the inside. This sheet-like electrode 1 comprises a conductive material, and is constituted of a flat sheet which is rectangular as a whole. On one of the longer sides of this sheet like electrode 1, a slit 3 is cut from a start point (cutting-in part) 2 nearest to its one end in parallel to a shorter side 4. and the slit 3 turns plural times at a right angle until it reaches an end point at a point 5 inside the sheet-like electrode.

In FIG. 1, the slit 3 is constituted of six relatively long effective linear portions $A^1$ parallel to the shorter side 1 and six relatively short linear portions which are not effective linear portions (hereinafter called "non-effective linear portion(s)") $B^1$ parallel to the longer side, and is a single slit continuous from the start point 2 to the end point 5. Connected respectively to two points (the numerals 6 and 7 in the figure) interposing the slit 3 in the vicinity of the start point of the slit 3 are two lead wires $8a$ and $8b$ extending from a coaxial tube 8.

Figure 2:
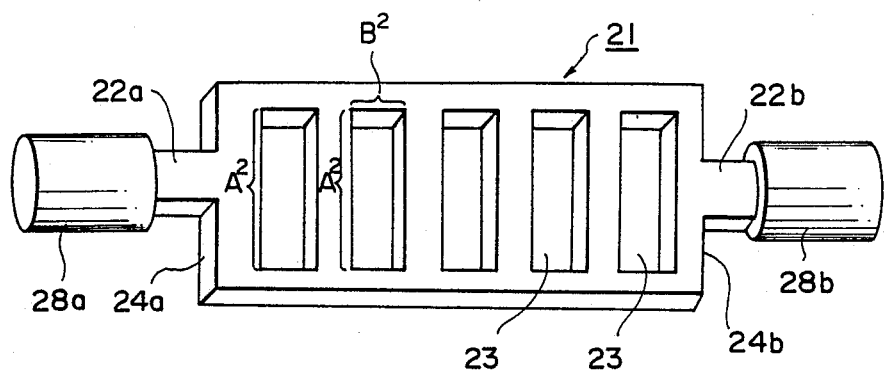

FIG. 2 is a perspective view illustrating another example of the sheet-like electrode, which is a sheet-like electrode having the slit in plurality.

This sheet-like electrode 21 also comprises a conductive material, and is constituted of a flat sheet which is rectangular as a whole. The slit 23 of the sheet-like electrode 21 comprises slits that form effective linear portions $A^2$ in parallel to shorter sides $24a$ and $24b$ of the sheet-like electrode 21, and the respective slits are separated. This sheet-like electrode 21 also has coaxial tube connecting portions $22a$ and $22b$ on its shorter sides $24a$ and $24b$, which portions are respectively connected to coaxial tubes $28a$ and $28b$.

Figure 3:
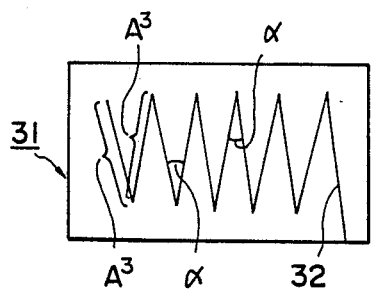
FIG. 3, FIG. 4, FIG. 5, FIG. 6, FIG. 7 and FIG. 8 are plan views illustrating other examples of the sheet-like electrode.
Figure 4:
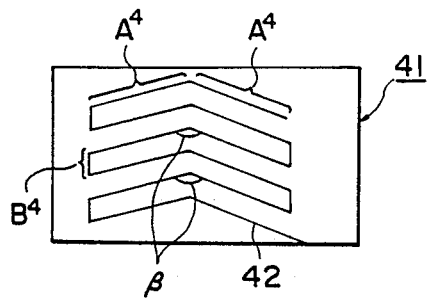
Figure 5:
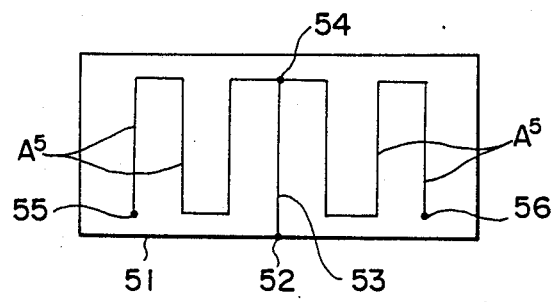
Figure 6:
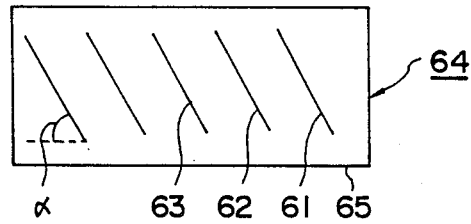

There is no particular limitation on the shape of the slit formed in the sheet-like electrode so long as it has at least one effective linear portion, and, besides the example illustrated in FIG. 1 or FIG. 2, may include, for example, the shapes as illustrated in FIG. 3 to FIG. 8. In the example of FIG. 3, a slit 32 is provided in a sheet-like electrode 31 in such a fashion that a plurality of effective linear portions $A^3$ only are continuously connected with each other through angles $\alpha$. In the example of FIG. 4, a slit 42 is provided in a sheet-like electrode 41 in such a fashion that sets of two effective linear portions $A^4$ connected with each other through angles $\beta$ are repeated in some number with the interposition of shorter non-effective linear portion $B^4$. In the example of FIG. 5, a slit cut in from the middle 52 of a longer side 51 is branched at the position of a point 54, and thereafter turns like that in FIG. 1 to form a plurality of effective linear portions $A^5$ before they respectively stop at end-points 55 and 56. In the example of FIG. 6, a plurality of slits 61, 62, 63, etc. each constituting the effective linear portion are provided in parallel to each other and at an angle $\gamma$ with respect to a longer side 65 of a sheet-like electrode 64.

Figure 7:
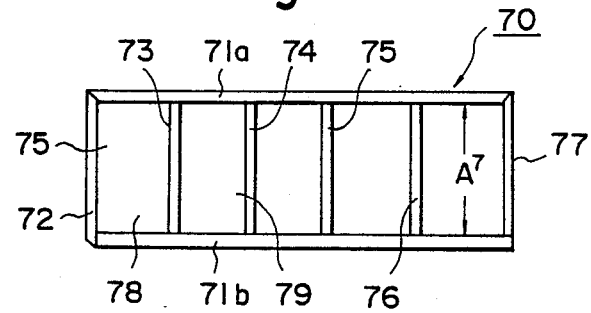
Figure 8:
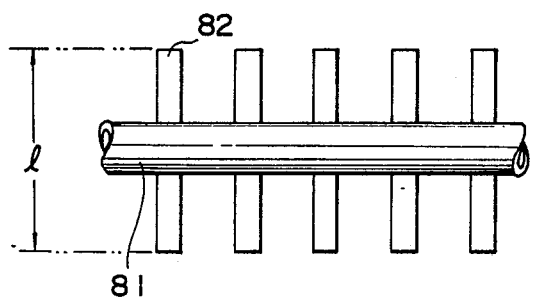

In the first process, it is also possible to use, besides the above, the sheet-like electrode having the shapes as illustrated in FIG. 7 and FIG. 8.

In FIG. 7, a sheet-like electrode 70 is formed of two supporting rods $71a$ and $71b$ comprising a conductive material, and rods 72, 73, 74, 75, 76 and 77 comprising a conductive material provided across the supporting rods $71a$ and $71b$ in equal intervals in the form of a ladder. Small, rectangular spaces 78, 79, etc. surrounded by the rods correspond to the slit described above, and the length $A^7$ of the rectangular space in the longitudinal direction constitutes the effective linear portion. In the example of FIG. 8, a plurality of blades comprising a conductive material are arranged in the same plane on the part at which only an inner guide tube 81 of a coaxial tube is bared, in such a fashion that the length l defined between both ends of blades opposing through the inner guide tube may correspond to the length of the effective linear portion.

There is no limitation on the shape of the sheet-like electrode, and its outline may be of any shape including a rectangular shape, as well as a circular shape.

The sheet-like electrode may not particularly be required to be flat, and may have a curved surface as a whole or in part or may have convexes or concaves, corresponding to the three-dimensional shape of the substrate surface to be treated.

Figure 9:
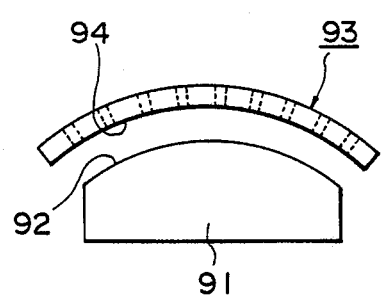
FIG. 9 and FIG. 10 are views illustrating an example of positional relationship in how the sheet-like electrode and a substrate having three-dimensional unevenness are arranged.
Figure 10:
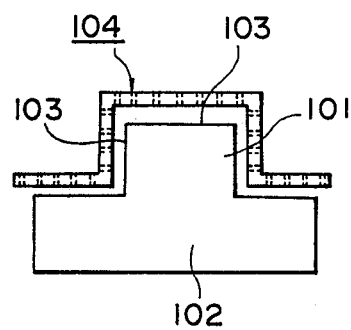
Figure 11:
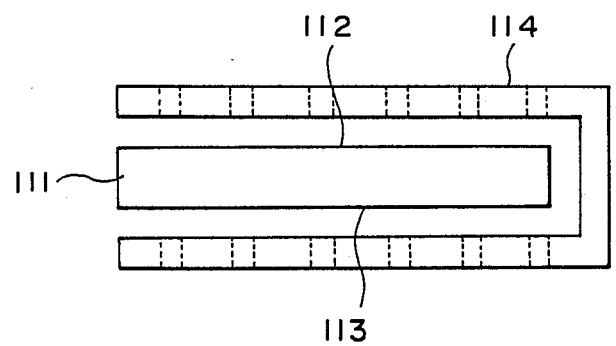
FIG. 11 is a view illustrating another example of positional relationship in how the sheet like electrode and the substrate are arranged.

FIG. 9 is a cross section illustrating a sheet-like electrode 93 suited to form a film on a spherical surface 92 of a substrate 91, where said electrode 93 is made to have an undersurface 94 formed in a concave surface in agreement with the spherical surface 92 of the substrate 91. FIG. 10 also is a cross section illustrating a sheet-like electrode 104 suited to form a film on a surface 103 of a substrate 102 having a rectangular convex 101, where said electrode 104 is formed with a rectangular concave in agreement with the convex 101 of the substrate 102, and is so designed that a film can be evenly formed on the whole top surface 103 of the substrate 102 as a whole. FIG. 11 is a cross section illustrating a sheet-like electrode 114 suited to form a film simultaneously on the surfaces 112 and 113 of a sheet-like substrate, where said electrode 114 is turned in U-shape and so designed that films can be formed on the whole of both surfaces 112 and 113 of the substrate 111.

The sheet-like electrode may also be provided in plurality and in parallel with appropriate spacing, thereby making it possible to form films simultaneously on both surfaces of the substrate.

Methods of introducing microwaves to the sheet-like electrode used in the first process may include, for example, a method in which an end of a coaxial cable or coaxial tube connected at the other end to a waveguide is connected to the sheet-like electrode, a method in which an end of a coaxial cable or coaxial tube connected at the other end to a waveguide is connected to one end of a parallel wire line and thereafter the other end of the parallel wire line is connected to the electrode, and a method in which an antenna provided in a waveguide and an antenna provided for the electrode are used.

Methods of introducing microwaves to the sheet-like electrode may also include a method in which a microwave is introduced to one end of the sheet-like electrode and, at the same time, another microwave is also introduced to the other end thereof, and a method in which a microwave is introduced to one end of the sheet-like electrode and a coaxial tube or waveguide is connected to the other end thereof, which is then connected to a termination (i.e., dummy load). These methods enable introduction of a microwave to the sheet-like electrode in a good efficiency, and are effective for obtaining stabler plasma. Specific examples of such methods of introducing the microwave to the sheet-like electrode may include (a) a method in which slits are arranged in the sheet-like electrode in a point-symmetrical or line-symmetrical fashion, and microwaves are introduced to symmetrically related two points on the electrode from respectively independent electric sources, and (b) a method in which slits are arranged in the sheet-like electrode in a point-symmetrical or line-symmetrical fashion, and microwaves are introduced to one of symmetrically related two points on the electrode, to the other of which a coaxial tube or waveguide is connected, which is then connected to a termination. Here, the termination is a device to let microwaves having not been consumed in generating plasma escape in a liquid such as water or oil through a waveguide or coaxial tube.

In the first process of this invention, it is further possible to form stabler plasma by applying a magnetic field to the sheet like electrode. In this instance, the magnetic flux density in the vicinity of the sheet like electrode may preferably be maintained at from 500 to 2,000 gauss, and an electromagnet, for example, can be used as a means for applying the magnetic field.

In the first process of this invention, a plasma zone in the form of mat (hereinafter called mat-like plasma zone) is so formed that it may cover the surface of the sheet-like electrode. The thickness represented by L in mm and the area represented by S in mm² of the mat-like plasma zone may preferably have a relation of:

$$S/L > 200$$

and also said plasma zone has an average energy density of 10 W/cm³ or more. The value of S/L otherwise 200 or less may result in formation of a plasma zone having a small two dimensional breadth, making it impossible to make large so much the area on which a film can be formed. The plasma zone may preferably have a thickness of usually from 1 to 40 mm, preferably from 3 to 20 mm.

The plasma zone may also preferably have an energy density of 10 W/cm³ or more on average, preferably from 10 to 1,000 W/cm³. The energy density otherwise less than 10 W/cm³ on average may result in a lowering of the rate of film formation on a large-area substrate surface.

There is no particular limitation on the material for the sheet-like electrode so long as it is a conductive material, and, specifically, there can be used any materials having a conductivity of $10^2$ ohm$^{-1}$cm$^{-1}$ or more at room temperature and usually having a good thermal resistance at 600° C. or more. Such materials may include, for example, transition metals such as iron, cobalt, nickel, manganese, chromium, vanadium, titanium, copper, zinc, yttrium, ruthenium, zirconium, niobium, molybdenum, rhodium, palladium, silver, tantaium, tungsten, rhenium, platinum, gold, thallium, lead and bismuth; aluminum; alloys of the above transition metals or aluminum, such as stainless steel, brass, bronze and super alloy; dispersion reinforce alloys comprising metal oxides dispersed in a metal, such as copperalumina, copper-silicon oxide, silver-alumina, silvercadmium oxide and nickel yttrium oxide; carbon materials such as carbon and graphite; and preferred among these are materials having a conductivity of $10^5$ ohm$^{-1}$cm$^{-1}$ or more, including copper, silver, aluminum, copper alloys and copper-alumina dispersion reinforced alloys. Surfaces of these materials may also be covered with electrical insulators or semiconductive materials such as glass, ceramics, silicon and diamond. The sheet-like electrode is fixed in a reaction vessel to be used, with an electrical insulator. The electrical insulator that can be used may include, for example, inorganic materials such as alumina, boron nitride, quartz glass, silicon nitride and zirconium oxide; and organic polymers such as nylon and polyethylene. However, inorganic materials must be used in the case of a high temperature.

In the first process, a gas containing at least one selected from the group consisting of an organic compound and an inorganic compound is positioned in the reaction vessel. Flow rate of these gases may range generally from 0.1 to 100,000 cc(STP)/min per 100 lit. of inner volume of the reaction vessel. Average pressure in the reaction vessel may range usually from 0.5 to 760 Torr, preferably from 1 to 200 Torr. These are expressed as general ranges, and may be selected depending on the type of films to be formed. For example, in instances in which films comprising the diamond-like substance are formed, the carbon-containing organic compound and hydrogen are used, where the gas flow rate of the carbon-containing organic compound may range usually from 0.01 to 10,000 cc(STP)/min per 100 lit. of inner volume of the reaction vessel, and the flow rate of hydrogen may range from 0.1 to 10,000 cc(STP)/min per 100 lit. of inner volume of the reaction vessel.

In forming films comprising the diamond-like substance, hydrogen and the carbon-containing organic compound may be separately fed to the reaction zone and then subjected to microwave discharge while mixing, or may be fed to the reaction zone in the form of a previously mixed gas and then subjected to the microwave discharge. In either case, a rare gas such as helium, argon or xenon may be mixed into the hydrogen, carbon-containing organic compound, or the mixed gas of these. There is no particular limitation on the proportion of the rare gas, but it may preferably be 80 mol or less per 100 mol of hydrogen.

Under the above conditions, the mat-like plasma usually with a thickness of 1 to 20 mm in approximation is generated over the whole surface of the sheet-like electrode. A substrate may be so disposed previously or thereafter that the substrate surface to be treated may come into contact with the plasma thus excited, so that the desired film comprising the diamond-like substance can be formed on the substrate surface. Here, when, for example, the sheet like electrode has an area of 10,000 mm², an applied electric power of about 1.5 kW results in excitation of plasma of about 5 mm in thickness on the surface of the electrode. Lowering of the applied electric power to 0.8 kW results in a plasma thickness lessened to about 2 mm, but the desired film comprising the diamond-like substance can be formed by bringing the substrate to come near to the electrode surface.

In the second process of this invention, the plasma of the gas containing at least one selected from the group consisting of an organic compound and inorganic compound, is generated by DC discharge and force to move by applying a magnetic field. The plasma generated by DC discharge comprises a high temperature or quasi-high temperature plasma generated in the form of an arc (hereinafter simply called "arced plasma").

To generate the arced plasma in the second process, used are, for example, the electrodes as illustrated in FIGS. 12A to 12C or FIG. 13.

Figure 12A:
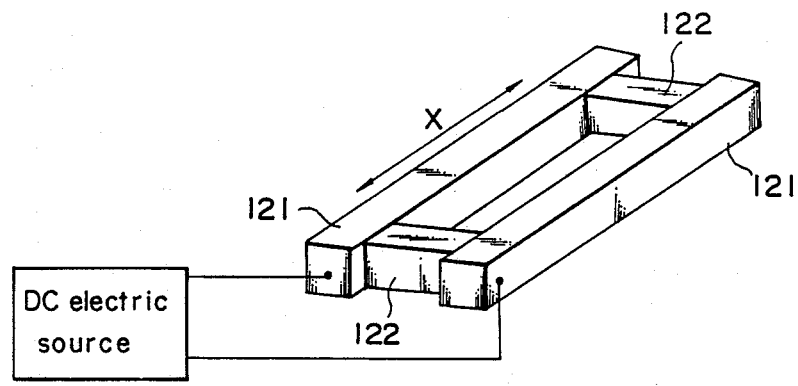
FIGS. 12A, 12B and 12C each illustrate an example of the discharge electrodes used in the second process of this invention.

FIG. 12A illustrates discharge electrodes comprising a pair of rod-like electrodes 121 connected to a DC electric source, and the two electrodes 121 are fixed so as to give a space, for example, of from 1 to 10 mm by use of an insulator 122 comprising aluminum or the like. The arced plasma is generated at part between the discharge electrodes, and forced to move in the longitudinal direction of the rod-like electrodes, as shown by arrow X in the figure, by applying a magnetic field formed by a magnet (not shown). The arced plasma generated at part between the discharge electrodes comes to be in the state that it protrudes up and down the discharge electrodes, so that a film can be formed on a substrate set near to the discharge electrodes.

Figure 12B:
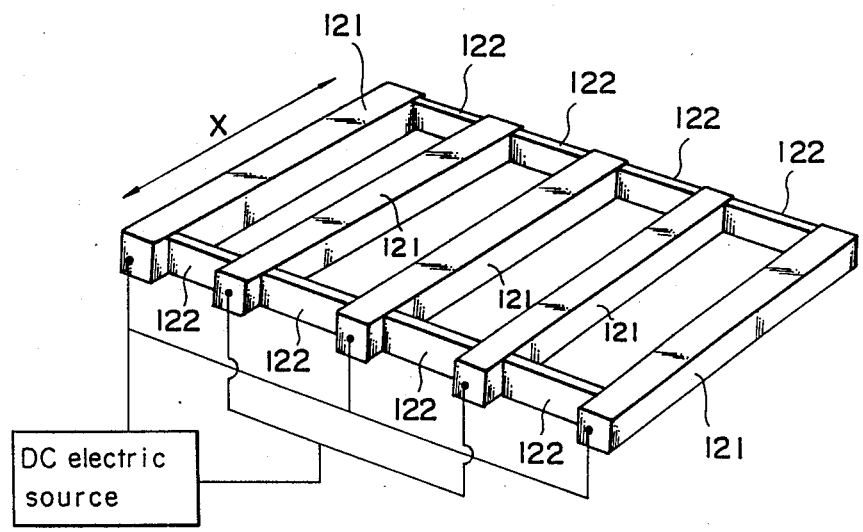

FIG. 12B illustrates an example of the discharge electrodes comprised of three or more rod-like electrodes 121 similar to those shown in FIG. 12A, which is suited to form films having a larger area.

Figure 12C:
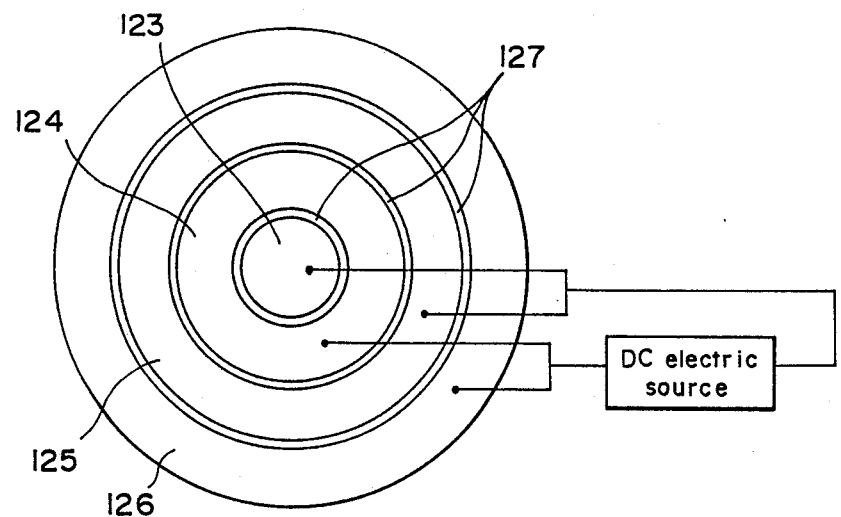

FIG. 12C illustrates an example in which a disc-like electrode 123 and electrodes 124, 126 and 126 comprised of ring shaped flat sheets are concentrically arranged and circular slits 127 are respectively formed therebetween, where the respective electrodes 123 to 126 are connected to a DC electric source as shown in the figure. The arced plasma is generated at part of each circular slit 127 and moves along the circular slit 127 by the effect of the magnetic field formed by an electromagnet (not shown). The arced plasma generated at part of each circular slit 127 comes to be in the state that it protrudes up and down the ring-shaped electrodes, and forced to move along the circular slit 127 by application of a magnetic field formed by an electromagnet, for instance, so that a film can be formed on a substrate set near to the discharge electrodes. In the embodiments, in FIG. 12A to FIG. 12C, a refrigerant may preferably be channeled inside the discharge electrodes to effect cooling.

Materials for the discharge electrodes used in the second process may include the same conductive materials process.

To generate the arced plasma in the second process, a voltage of from 10 to 900 volt is applied between the electrodes by using a DC electric source.

In the second process also, a gas containing at least one selected from the group consisting of an organic compound and an inorganic compound is flowed in the reaction vessel, and flow rate of these gases usually ranges from 100 to 100,000 cc(STP)/min per 100 lit. of inner volume of the reaction vessel.

In particular, in the second process, the gas may preferably be positioned between the electrodes in the form of a jet flow so that the arced plasma is forced to jet from the discharge electrodes like a plasma jet. Thus, gas flow velocity between the electrodes, necessary for generating the arced plasma like a jet, may preferably be set to from 0.01 to 600 m/sec, particularly preferably from 0.05 to 100 m/sec.

Average pressure in the reaction vessel may range usually from 10 to 760 Torr, and energy density of the plasma may range usually from 10 to 1,000 W/cm$^3$ on time average.

Figure 13:
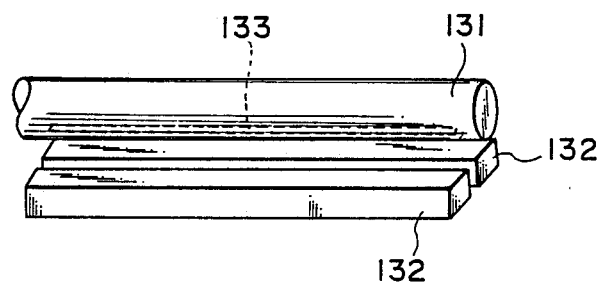
FIG. 13 is a view explanatory of a pipe provided with a slit through which a plasma generating gas is flowed like a jet flow into between a pair of discharge electrodes.

Methods by which the gas is fed to the reaction zone in the second process of this invention may include the same methods as in the first process. In particular, to flow the gas in the form of a jet flow between the discharge electrodes, available is a method in which, for example, a pipe 131 as illustrated in FIG. 13 is set on the discharge electrodes 132 and a gas is fed through this pipe 131. This pipe 131 is provided with a gas-jetting slit 133 in the manner that the slit may face the discharge electrodes 132 and be positioned between two adjacent discharge electrodes, so that the gas can be fed from this gas-jetting slit to between the two adjacent discharge electrodes in the form of a jet flow.

In the second process, the generated arced plasma is forced to move by applying a magnetic field. This magnetic field is applied in the direction perpendicular to the direction of the flow of electric discharge current caused by DC discharge. Magnitude of magnetic flux density ranges usually from 80 to 2,000 gauss. To produce this magnetic field an electromagnet for forming a magnetic field in the direction perpendicular to the direction of the flow of electric discharge current caused by DC discharge is placed, for example, at the upper and lower parts or right and left parts of the discharge electrodes as exemplified in the above.

The position of the discharge between the discharge electrodes can be moved by applying this electric field, and, when, for example, the discharge electrodes as shown in FIG. 12A or FIG. 12C are used, a plasma sensor having the function to give a command to reverse the direction of the magnetic field at every time when it detects the plasma may be provided at both ends of a section in which the arced plasma reciprocates, thus enabling the reversal of the direction of movement. This reversal of the direction of the magnetic field may also be achieved by previously measuring the velocity of movement of the arced plasma, and automatically reversing the direction of the electric current for the electromagnet according to a period, for example, of about 1 second or less, determined on the basis of the measurements.

The first and second processes of this invention is carried out in a reaction vessel, but there is no particular limitation on the type of the reaction vessel to be used, and may be included bell jar reaction vessels, as well as those exemplified by rectangular parallelepiped reaction vessels. There is also no particular limitation on a vacuum exhaust system connected to the reaction vessel, and there can be used those of various types commonly used.

The first and second processes of this invention may also optionally provided with, for example, a substrate-supporting means such as a substrate stand, a substrate-heating means and a substrate cooling means. Particularly when the film comprising a diamond-like substance is formed, the substrate temperature may preferably be maintained at 600° to 900° C. When it is necessary to heat the substrate, an infrared image furnace or a resistance heater can be used as the substrate stand, and, when it is necessary to cool the substrate, a water-cooling type cooling stand can be used as the substrate stand.

On the substrate on which a film can be formed by the first or second process of this invention, there is no particular limitation so long as it has thermal resistance, and there may be included ceramics such as alumina, tungsten carbide and titanium nitride: semiconductors such as silicon, germanium and gallium arsenic; metals such as molybdenum, tungsten, tantalum. copper and iron; dispersion reinforced alloys comprising metal oxide particles dispersed in copper or copper alloys; and quartz glass.

These substrates may be used as they are, or may be used after surfaces are scratched using a diamond paste or the like to make it easier to form films.

EXAMPLES

The process of this invention will be described below in greater detail by way of Examples.

EXAMPLE 1

Figure 14:
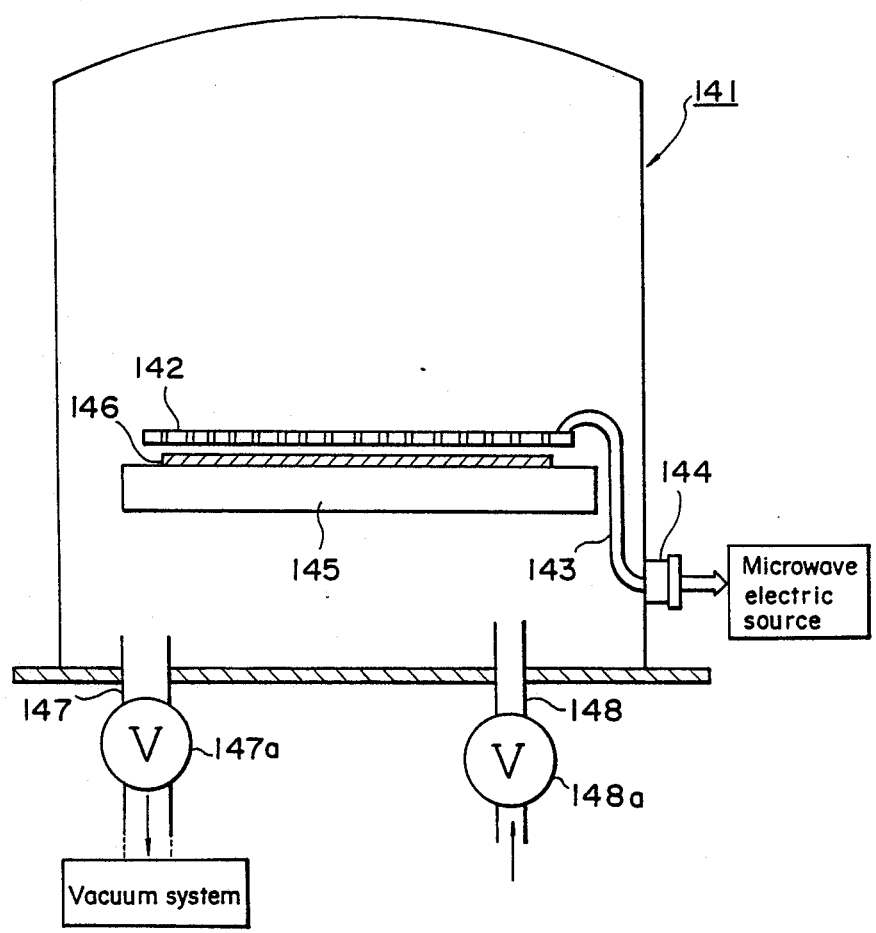
FIG. 14 is a schematic view illustrating an example of an apparatus for carrying out the process of the first process of this invention.

Using the apparatus schematically illustrated in FIG. 14, formation of films comprising a diamond-like substance was carried out on substrates. This apparatus is equipped with a sheet-like electrode 142 fixed horizontally in a bell jar reaction vessel 141, and the electrode 142 is connected to a microwave electric source for introducing a microwave with a wavelength of 122 mm through a coaxial cable 143 and a microwave-introducing terminal 144.

Figure 15:
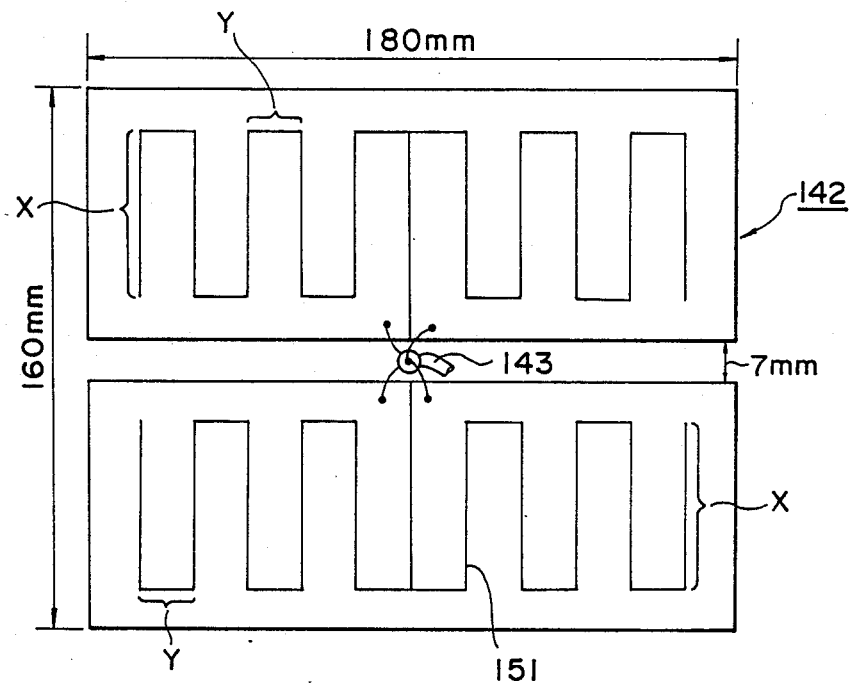
FIG. 15 is a plan view of the sheet-like electrode used therein.

A substrate stand 145 made of alumina, provided in the reaction vessel is equipped with an infrared image furnace, which can heat to a desired temperature a substrate 146 placed on the substrate stand. Connected to the bottom of the reaction vessel are an exhaust tube 147 connected to a vacuum exhaust system, and a gas inlet tube for introducing a gas used for generating plasma to which valves 147 and 148 are respectively provided. The sheet-like electrode 142 is made of copper and comprised of two sheets of the sheet like electrode exemplified in FIG. 5, which are arranged and connected to the coaxial cable 143 as illustrated in FIG. 15 and are rectangular sheet-like electrodes having a dimension of 160×180×1 mm when the two sheets are put side by side. A slit 151 has a slit width of 4 mm, twenty-two (22) effective linear portions whose length X shown in FIG. 15 is 61 mm, and non-effective linear portions which keep every two adjacent effective linear portions apart by a distance of 15 mm as shown by Y in FIG. 15.

Used as the substrate 146 was a silicon wafer having a diameter of 2 inches. This substrate was placed in a beaker together with diamond particles having an average particle diameter of 3 micrometers, maintained for 10 minutes in an ultrasonic washer filled with water together with the whole beaker to carry out a pretreatment to make scratches on the substrate surface, and thereafter placed on the substrate stand. The top surface of the substrate and the sheet-like electrode was held 4 mm apart.

For Test Nos. 1 to 14, kind of gas used for generating plasma, pressure, energy density of plasma and substrate temperature were varied as shown in Table 1, and treatments of the tests were carried out for 2 hours under the conditions respectively shown in Table 1. The energy density is expressed by a value obtained by dividing the applied microwave electric power by the volume of generated plasma. Also, the substrate temperature was measured by using an alumel-chromel thermocouple fixed to the substrate, making control by adjusting the electric power for the infrared image furnace. At the time of the measurement, however, the application of the microwave electric power was stopped for a short time.

(1) Average thickness, scattering of thickness and crystallinity of the films comprising a diamond-like substance thus obtained on the substrate are shown together in Table 1. Here, the average thickness was determined by observing cross sections of the substrates on which films comprising a diamond-like substance were formed, with use of a scanning electron microscope. The scattering of thickness is expressed by an arithmetical mean of the differences between the thicknesses of ten samples selected at random and the average thickness thereof. Also, the crystallinity is indicated by hd/ha which is the ratio of the height hd at a peak around 1,330 cm$^{-1}$ in the Ramman spectrum (the one inherent in crystal diamond) and the height ha at a peak around 1500$^{-1}$ in the same (the one inherent in amorphous caron). It can be evaluated that the greater this ratio is, the higher the diamond formation is.

TABLE 1

| Test No. | Kind of gas & gas flow rate cc(STP)/min | Pressure (Torr) | Plasma energy density (W/cm$^3$) | Substrate temperature (°C.) | Plasma zone thickness (mm) | S/L | Average film thickness (μm) | Film thickness scattering (μm) | Crystallinity |
|---|---|---|---|---|---|---|---|---|---|
| 1 | CH$_4$(10) + H$_2$(1,000) | 20 | 16 | 800 | 12 | 2,400 | 4 | <1 | >10 |
| 2 | CH$_4$(10) + H$_2$(1,000) | 100 | 24 | 780 | 4 | 7,200 | 6 | <1 | >10 |
| 3 | CH$_3$OH(15) + H$_2$(1,000) | 10 | 12 | 750 | 14 | 2,057 | 5 | <1 | >10 |
| 4 | CH$_3$OH(15) + H$_2$(1,000) | 80 | 19 | 850 | 6 | 4,800 | 12 | 4 | >10 |
| 5 | CH$_3$NH$_2$(10) + H$_2$(800) | 5 | 13 | 810 | 14 | 2,057 | 5 | <1 | >10 |
| 6 | CH$_3$NH$_2$(10) + H$_2$(800) | 100 | 27 | 740 | 4 | 7,200 | 7 | <1 | >10 |
| 7 | CS$_2$(8) + H$_2$(700) | 10 | 14 | 820 | 16 | 1,800 | 8 | <1 | 5 |
| 8 | CS$_2$(8) + H$_2$(700) | 90 | 22 | 840 | 4 | 7,200 | 9 | 2 | 7 |
| 9 | CO$_2$(10) + H$_2$(1,200) | 40 | 21 | 830 | 10 | 2,880 | 1 | <1 | 6 |
| 10 | CO$_2$(10) + H$_2$(1,200) | 80 | 35 | 910 | 6 | 4,800 | 2 | <1 | 7 |
| 11 | CH$_3$F(10) + H$_2$(1,000) | 20 | 16 | 820 | 12 | 2,400 | 7 | <1 | >10 |
| 12 | CH$_3$F(10) + H$_2$(1,000) | 100 | 24 | 840 | 4 | 7,200 | 9 | 2 | >10 |
| 13 | CF$_4$(10) + H$_2$(1,000) | 15 | 20 | 830 | 12 | 2,400 | 8 | >1 | 8 |
| 14 | CF$_4$(10) + H$_2$(1,000) | 40 | 27 | 870 | 10 | 2,880 | 10 | 3 | 7 |

Figure 16:
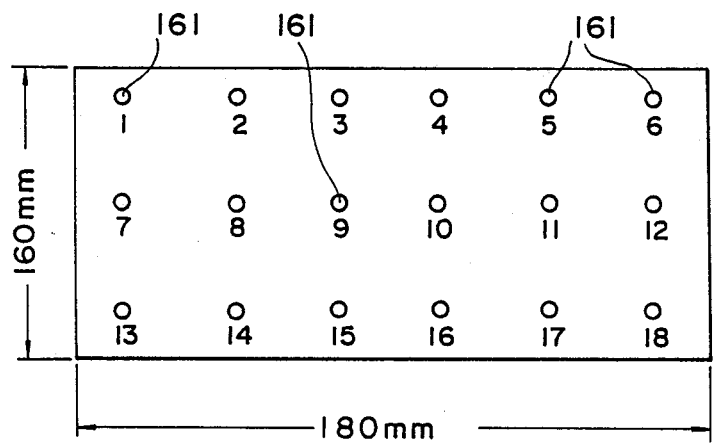
FIG. 16 is a view explanatory of a substrate on which a diamond-like substance is formed for measuring electrical resistance of the diamond-like substance in Example 1-(2)

(2) In Test Nos. 15, 16 and 17, films comprising a diamond-like substance were obtained on molybdenum plates under the same plasma-generating conditions as in Test Nos. 5, 7 and 11, respectively, and deposited on their surfaces were gold electrodes 161 in spots with a diameter of 1 mm at eighteen positions as shown in FIG. 16. Each gold electrode was numbered as shown in the figure, and measured was electrical resistance between each electrode and molybdenum plate. Results obtained are shown in Table 2. Here, since the magnitude of the electrical resistance is proportional to the film thickness of the diamond like substance, the results shown in Table 2 tell that films comprising a diamond like substance were uniformly formed on the molybdenum sheets.

TABLE 2

(Unit: ohm)

| Measure point | Test 15 | Test 16 | Test 17 |
|---|---|---|---|
| 1 | $5 \times 10^{11}$ | $5 \times 10^{11}$ | $7 \times 10^{11}$ |
| 2 | $6 \times 10^{11}$ | $7 \times 10^{11}$ | $8 \times 10^{11}$ |
| 3 | $6 \times 10^{11}$ | $8 \times 10^{11}$ | $8 \times 10^{11}$ |
| 4 | $6 \times 10^{11}$ | $8 \times 10^{11}$ | $8 \times 10^{11}$ |
| 5 | $6 \times 10^{11}$ | $7 \times 10^{11}$ | $7 \times 10^{11}$ |
| 6 | $4 \times 10^{11}$ | $6 \times 10^{11}$ | $7 \times 10^{11}$ |
| 7 | $4 \times 10^{11}$ | $7 \times 10^{11}$ | $8 \times 10^{11}$ |
| 8 | $6 \times 10^{11}$ | $8 \times 10^{11}$ | $7 \times 10^{11}$ |
| 9 | $6 \times 10^{11}$ | $9 \times 10^{11}$ | $8 \times 10^{11}$ |
| 10 | $6 \times 10^{11}$ | $9 \times 10^{11}$ | $8 \times 10^{11}$ |
| 11 | $6 \times 10^{11}$ | $8 \times 10^{11}$ | $8 \times 10^{11}$ |
| 12 | $4 \times 10^{11}$ | $6 \times 10^{11}$ | $7 \times 10^{11}$ |
| 13 | $5 \times 10^{11}$ | $5 \times 10^{11}$ | $8 \times 10^{11}$ |
| 14 | $5 \times 10^{11}$ | $7 \times 10^{11}$ | $8 \times 10^{11}$ |
| 15 | $6 \times 10^{11}$ | $8 \times 10^{11}$ | $7 \times 10^{11}$ |
| 16 | $6 \times 10^{11}$ | $8 \times 10^{11}$ | $7 \times 10^{11}$ |
| 17 | $6 \times 10^{11}$ | $7 \times 10^{11}$ | $8 \times 10^{11}$ |
| 18 | $5 \times 10^{11}$ | $7 \times 10^{11}$ | $7 \times 10^{11}$ |

EXAMPLE 2

Figure 17:
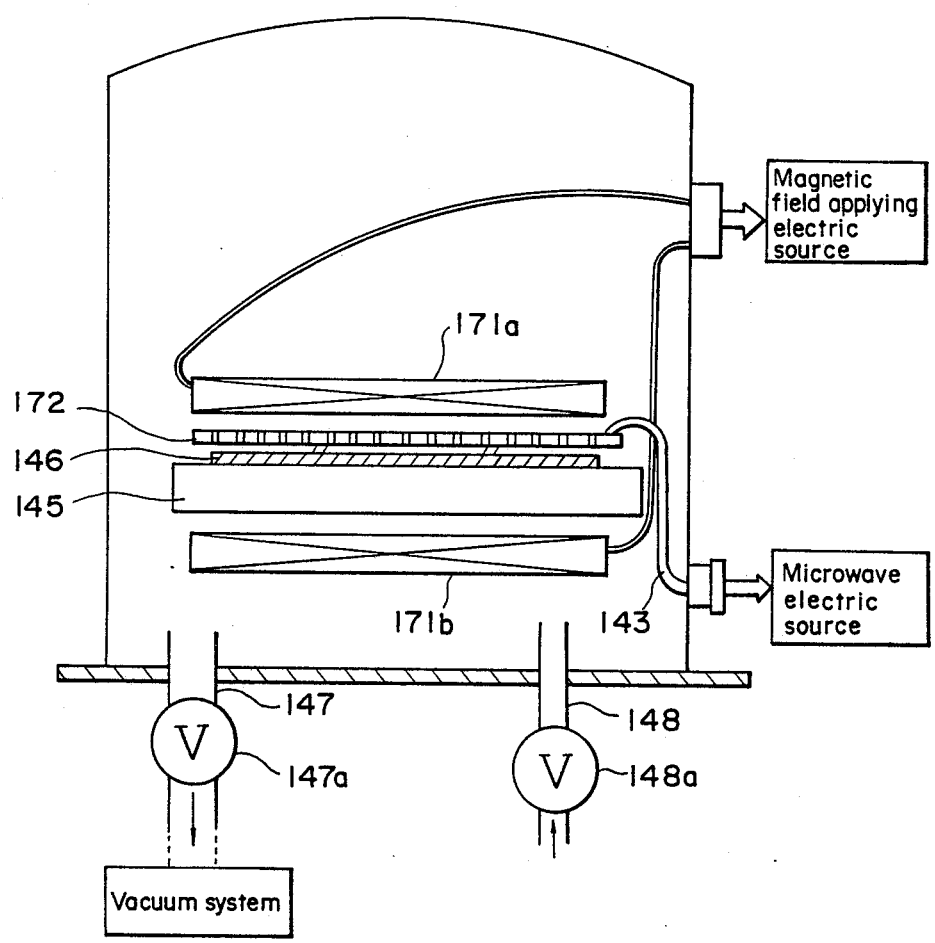
FIG. 17, FIG. 18 and FIG. 19 are schematic views of other examples of the apparatus for carrying out the process of this invention.

Using the apparatus schematically illustrated in FIG. 17, formation of films comprising a diamond-like substance was carried out on substrates. The same components as those in the apparatus illustrated in FIG. 14 are denoted by the same numerals. This apparatus has the same constitution as the apparatus illustrated in FIG. 14 except that the apparatus illustrated in FIG. 14 is additionally provided with a coil 171a above the sheet-like electrode 172 and also a coil 171b beneath the substrate stand 145, and further a sheet-like electrode 172 made of molybdenum having the same shape and dimension was used in place of the sheet-like electrode 142 made of copper.

Used as the substrate 146 was the same as in Example 1, and the top surface of the substrate 146 and the sheet-like electrode 172 were held 4 mm apart. The magnetic field produced by the coils 171a and 171b were set so as to give 875 gauss in the vicinity of the substrate 146.

For Test Nos. 19 to 22, kind of gas used for generating plasma, pressure, energy density of plasma and substrate temperature were varied as shown in Table 3, and treatments of these tests were carried out for 2 hours under the conditions respectively shown in Table 3. Average thickness, scattering of thickness and crystallinity of the resulting films comprising a diamond-like substance were measured in the same manner as in Example 1, and the results obtained are shown in Table 3.

EXAMPLE 3

Formation of films comprising a diamond-like substance was carried out on substrates, using the same apparatus as the apparatus schematically illustrated in FIG. 17 and used in Example 2, except that the sheet-like electrode 172 used therein was replaced by a sheet-like electrode having the slits as exemplified in FIG. 2, having a rectangular shape of $100 \times 80 \times 1$ mm and made of molybdenum, in which five slits having a length of 61 mm at the effective linear portion $A^2$ and a slit width $B^2$ of 12 mm are provided at intervals of 7 mm.

For Test Nos. 23 to 26, kind of gas use for generating plasma, pressure, energy density of plasma and substrate temperature were varied as shown in Table 3, and treatments of these tests were carried out for 2 hours under the conditions respectively shown in Table 3. Average thickness, scattering of thickness and crystallinity of the resulting films comprising a diamond-like substance were measured in the same manner as in Example 1, and the results obtained are shown in Table 3.

TABLE 3

| Test No. | Kind of gas & gas flow rate cc(STP)/min | Pressure (Torr) | Plasma energy density (W/cm³) | Substrate temperature (°C.) | Plasma zone thickness (mm) | S/L | Average film thickness (μm) | Film thickness scattering (μm) | Crystallinity |
|---|---|---|---|---|---|---|---|---|---|
| 19 | CH₄(10) + H₂(1,000) | 20 | 30 | 820 | 18 | 3,600 | 5 | <2 | >10 |
| 20 | CH₄(10) + H₂(1,000) | 100 | 42 | 810 | 10 | 2,880 | 7 | <2 | >10 |
| 21 | CH₃OH(15) + H₂(1,000) | 10 | 28 | 820 | 20 | 1,440 | 6 | <2 | >10 |
| 22 | CH₃OH(15) + H₂(1,000) | 80 | 38 | 810 | 12 | 2,400 | 14 | <5 | >10 |
| 23 | CH₄(10) + H₂(1,000) | 20 | 29 | 820 | 18 | 444 | 5 | <1 | >10 |
| 24 | CH₄(10) + H₂(1,000) | 100 | 43 | 815 | 10 | 800 | 8 | <2 | >10 |
| 25 | CH₃OH(15) + H₂(1,000) | 10 | 28 | 815 | 20 | 400 | 6 | <2 | 5 |
| 26 | CH₃OH(15) + H₂(1,000) | 80 | 39 | 810 | 12 | 667 | 15 | <5 | 7 |

EXAMPLE 4

Figure 18:
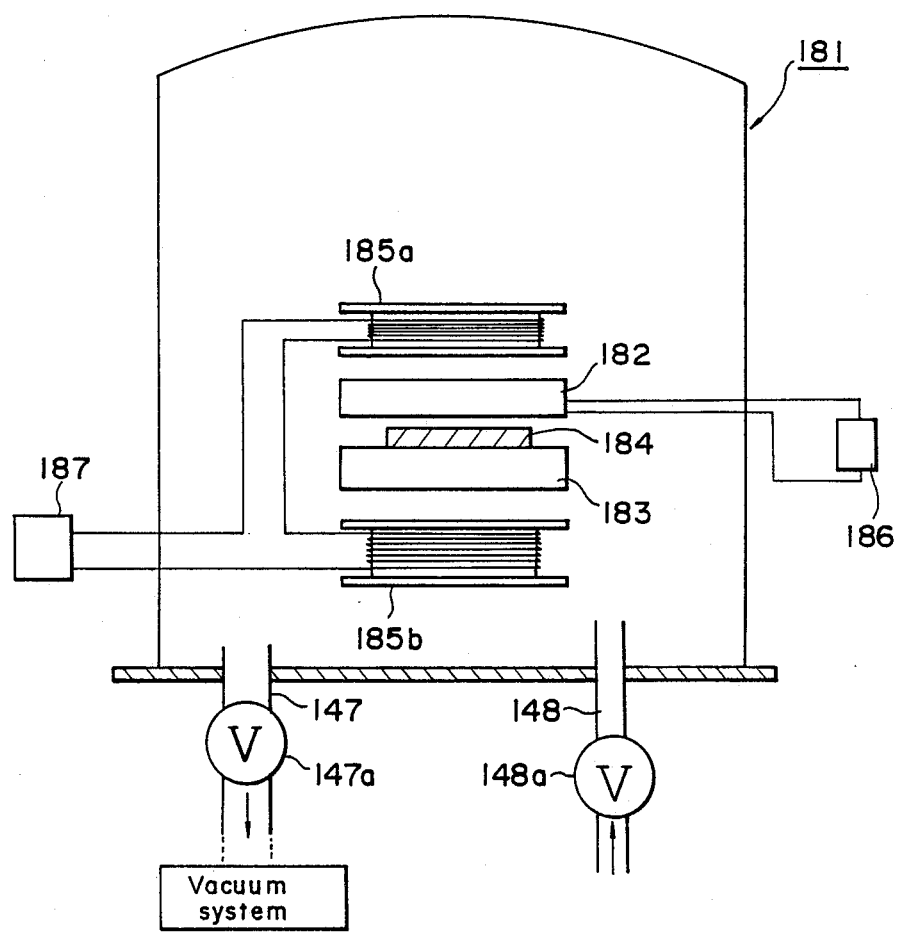

Using the apparatus schematically illustrated in FIG. 18, formation of films comprising a diamond-like substance was carried out on substrates. This apparatus is equipped with discharge electrodes 182 internally holding a cooling refrigerant pipe (not shown) and fixed horizontally in a bell ar reaction vessel 181, and said electrodes 182 are connected to a DC electric source 186. A substrate stand 183 made of alumina and provided inside the reaction vessel is equipped therein with an infrared image furnace and a cooling refrigerant pipe (not shown), so that a substrate 184 placed on said substrate stand can be maintained at a desired temperature. Electromagnets 185a and 185b are further provided above the discharge electrodes 12 and beneath the substrate stand 184, respectively, in such a manner that the electromagnets may sandwich these. The electromagnets 185a and connected to an electric source 187 provided outside the reaction vessel, and can form electric field in the direction perpendicular to the electric current flowing between the electrodes. Provided at the bottom of the reaction vessel are an exhaust tube, a gas inlet tube and so forth in the same manner as in the apparatus illustrated in FIG. 14. These are denoted in FIG. 18 with the same numerals as in FIG. 14.

Average thickness, scattering of thickness and crystallinity of the resulting films comprising a diamond-like substance were measured in the same manner as in Example 1, and the results obtained are shown in Table 4.

TABLE 4

| Test No. | Kind of gas & gas flow rate cc(STP)/min | Average pressure (Torr) | Plasma energy density (W/cm$^3$) | Substrate temperature (°C.) | Average film thickness (μm) | Film thickness scattering (μm) | Crystallinity |
|---|---|---|---|---|---|---|---|
| 27 | CH$_4$(10) + H$_2$(1,000) | 20 | 90 | 800 | 22 | 3 | >10 |
| 28 | CH$_4$(10) + H$_2$(1,000) | 100 | 200 | 600 | 14 | 2 | 8 |
| 29 | CH$_3$OH(15) + H$_2$(1,000) | 10 | 80 | 550 | 12 | 2 | 6 |
| 30 | CH$_3$OH(15) + H$_2$(1,000) | 80 | 170 | 750 | 18 | 3 | 8 |
| 31 | CH$_3$NH$_2$(10) + H$_2$(800) | 5 | 50 | 850 | 16 | 2 | >10 |
| 32 | CH$_3$NH$_2$(10) + H$_2$(800) | 100 | 170 | 700 | 20 | 3 | 7 |
| 33 | CO$_2$ + H$_2$(1,200) | 40 | 100 | 800 | 14 | 2 | >10 |
| 34 | CO$_2$ + H$_2$(1,200) | 80 | 180 | 650 | 7 | <1 | 7 |

The discharge electrodes 182 correspond to the electrodes of the type shown in FIG. 12B, and are comprised of five rod-like electrodes with a dimension of 10×10×200 mm each, which are so arranged that anodes and cathodes may alternate. Of these, the electrodes serving as anodes are made of copper, and the electrodes serving as cathodes are made of tungsten. Electrodes adjacent to each other have a spacing of 5 mm, and both ends of each discharge electrode are fixed with insulators 122 made of alumina.

As the substrate 184, a silicon wafer of 70×200×0.3 mm was placed on the substrate stand 183.

The top surface of the substrate and the discharge electrodes were held 5 mm apart. Voltage of the electric source 187 was adjusted so that electric field produced by the electromagnets 185a and 185b may come to be about 400 gauss in the vicinity of the discharge electrodes 182, thus forcing the arced plasma to move. Plasma sensors (not shown) were further provided on both ends of the discharge electrodes 182 to reverse the electric current of the electric source 187 at every time when the arced plasma reaches extremities of the discharge electrodes 182.

For Test Nos. 27 to 34, kind of was used for generating plasma, pressure, energy density of plasma and substrate temperature were varied as shown in Table 4, and treatments of these tests were carried out for 1 hour under the conditions respectively shown in Table 4. The energy density is expressed by a value obtained by dividing the applied microwave electric power by the whole volume over the area in which the plasma was generated and moved. The substrate temperature was also measured in the same manner as in Example 1.

EXAMPLE 5

Figure 19:
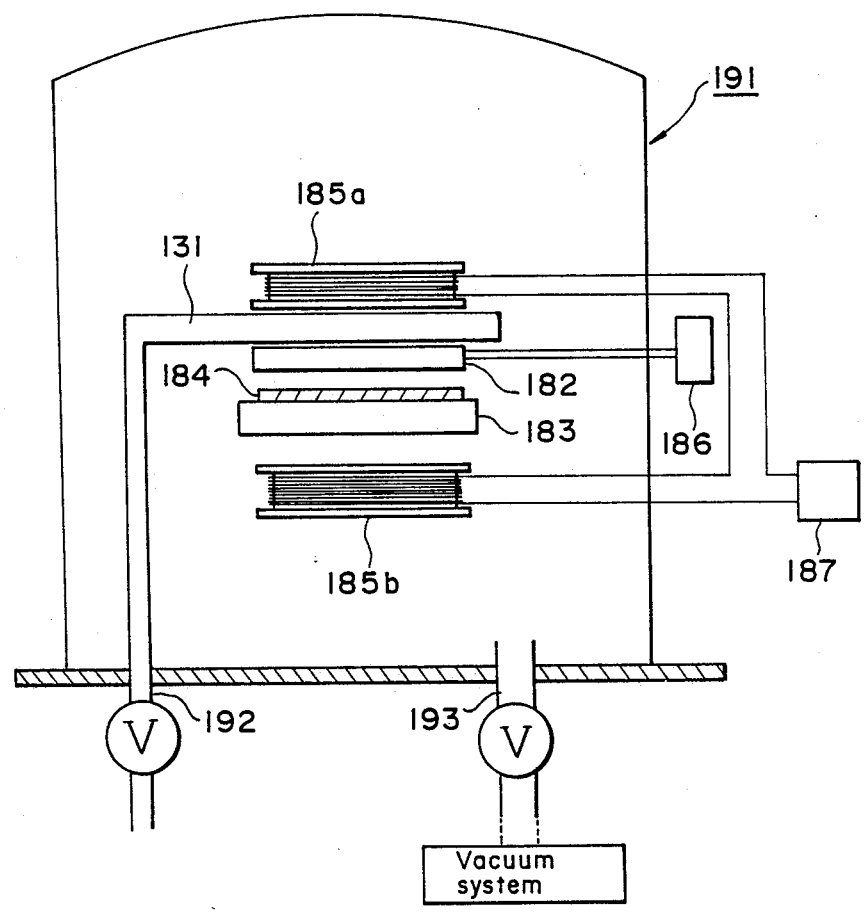

Using the apparatus schematically illustrated in FIG. 19, formation of films comprising a diamond-like substance was carried out on substrates. The same components as in FIG. i3 and FIG. 18 are denoted by the same numerals. This apparatus is the same as the apparatus illustrated in FIG. 18 and used in Example 4, except that four pipes 133 having a gas-jetting slit 133 from which a plasma generating was is flowed into between the discharge electrodes in the form of a jet flow, as exemplified in FIG. 13, was set between the discharge electrodes 182 and the electromagnet 185a positioned above the discharge electrodes 182. This gas jetting slit 133 is 1 mm wide and 200 mm long, and provided in the manner that it may face the center of the slit between electrodes as described with reference to FIG. 13. The gas jetting slit 133 and the discharge electrodes 182 are held 5 mm apart. The pipe 131 is connected to a gas inlet tube 192 for introducing plasma generating gas, provided at the bottom of a reaction vessel 191. An exhaust tube 193 is also connected to the bottom of the reaction vessel 191.

For Test Nos. 35 to 42, kind of gas used for generating plasma, pressure, energy density of plasma and substrate temperature were varied as shown in Table 5, and treatments of these tests were carried out for 1 hour under the conditions respectively shown in Table 5.

Average thickness, scattering of thickness and crystallinity of the resulting films comprising a diamond-like substance were measured in the same manner as in Example 1, and the results obtained are shown in Table 5.

TABLE 5

| Test No. | Kind of gas & gas flow rate cc(STP)/min | Average pressure (Torr) | Gas flow velocity between discharge electrodes (m/sec) | Plasma energy density (W/cm$^3$) | Substrate temperature (°C.) | Average film thickness (μm) | Film thickness scattering (μm) | Crystallinity |
|---|---|---|---|---|---|---|---|---|
| 35 | CH$_4$(10) + H$_2$(1,000) | 20 | 3.2 | 120 | 850 | 60 | 5 | >10 |
| 36 | CH$_4$(10) + H$_2$(1,000) | 100 | 0.6 | 300 | 620 | 42 | 4 | 7 |

TABLE 5-continued

| Test No. | Kind of gas & gas flow rate cc(STP)/min | Average pressure (Torr) | Gas flow velocity between discharge electrodes (m/sec) | Plasma energy density (W/cm$^3$) | Substrate temperature (°C.) | Average film thickness (μm) | Film thickness scattering (μm) | Crystallinity |
|---|---|---|---|---|---|---|---|---|
| 37 | CH$_3$OH(15) + H$_2$(1,000) | 10 | 6.4 | 100 | 600 | 55 | 3 | 7 |
| 38 | CH$_3$OH(15) H$_2$(1,000) | 80 | 1.1 | 200 | 800 | 67 | 4 | >10 |
| 39 | CH$_3$NH$_2$(10) + H$_2$(800) | 5 | 10.3 | 80 | 900 | 47 | 2 | >10 |
| 40 | CH$_3$NH$_2$(10) + H$_2$(800) | 100 | 1.2 | 250 | 780 | 60 | 4 | 8 |
| 41 | CO$_2$(10) + H$_2$(1,200) | 40 | 1.9 | 150 | 870 | 47 | 3 | >10 |
| 42 | CO$_2$(10) + H$_2$(1,200) | 80 | 0.95 | 330 | 710 | 33 | <1 | 9 |

What is claimed is:

1. A process of forming a film on a substrate, which comprises bringing a substrate into contact with a plasma zone formed by generating, by use of a discharge electrode, a high temperature or quasi-high temperature plasma of a gas containing at least carbon-containing compound, said process including the steps of:
providing a sheet-like electrode with a slit having a linear portion; and
connecting said electrode to a source of microwave electric energy.

2. The process of claim 1, wherein said plasma zone is one in the form of mat covering the surfaces of the sheet-like electrode with a relation of:

$$S/L > 200,$$

wherein S represents the area of the plasma zone in mm$^2$ and L represents the average thickness of the plasma zone in mm, and has an average energy density of at least 10 W/cm$^3$.

3. The process of claim 1, wherein said linear portion satisfies the condition expressed by the equation:

$$l = n \times \lambda/2$$

wherein l represents the length of said linear portion and λ represents the wavelength of a microwave supplied from said microwave electric source and n is an integer of at least one.

4. The process of claim 3, said slit has a width of not less than 1 mm and less than λ/2.

5. The process of claim 1, wherein the whole length of said linear portions is from 0.1 to 6 cm/cm$^2$ with respect to the area of the substrate surface on which a film is to be formed or the area of the sheet-like electrode.

6. The process of claim 1, wherein said sheet-like electrode is connected to a termination through a coaxial tube or waveguide.

7. The process of claim 1, wherein a magnetic field is applied to said sheet-like electrode, thereby forming stabler plasma.

8. The process of claim 7, wherein said magnetic field is applied such that the magnetic flux density in the vicinity of the sheet like electrode is from 500 to 2,000 gauss.

9. The process of claim 1 for formation of a film comprising a diamond-like substance, wherein said gas comprises hydrogen and a carbon containing organic compound.

10. The process of claim 9, wherein said gas comprises the carbon-containing organic compound in an amount of 0.1 to 5 mol per 100 mol of hydrogen.

11. The process of claim 9, wherein said carbon-containing organic compound is an organic compound having 1 to 4 carbon atoms.

12. The process of claim 11, wherein said organic compound is at least one member selected from the group consisting of methane, ethane, propane, butane, ethylene, propylene, butadiene, allylamine, methylamine, ethylamine, carbon disulfide, methanol, ethanol, formaldehyde, acetaldehyde, methyl ethyl ketone, formic acid and ethyl acetate.

13. A process of forming a film on a substrate, which comprises bringing a substrate into contact with arced plasma of a gas containing at least one carbon-containing compound, said process including the steps of:
generating the arced plasma in a slit of a DC discharge electrode; and
moving the arced plasma upon a substrate by applying a magnetic field.

14. The process of claim 13, wherein the gas containing at least one carbon-containing compound is positioned between said electrodes in the form of a jet flow.

15. The process of claim 14, wherein said gas is positioned between the electrodes at a flow rate of from 0.01 to 500 m/sec.

16. The process of claim 13, wherein said magnetic field has a magnetic flux density of 80 to 2,000 gauss.

17. The process of claim 13 for formation of a film comprising a diamond-like substance, wherein said gas comprises hydrogen and a carbon-containing organic compound.

18. The process of claim 13, wherein said gas comprises the carbon-containing organic compound in an amount of 0.1 to 5 mol per 100 mol of hydrogen.

19. The process of claim 18, wherein said carbon-containing organic compound is an organic compound having 1 to 4 carbon atoms.

20. The process of claim 19, wherein said at least one carbon-containing compound is at least one member selected from the group consisting of methane, ethane, propane, butane, ethylene, propylene, butadiene, allylamine, methylamine, ethylamine, carbon disulfide, methanol, ethanol, formaldehyde, acetaldehyde, methyl ethyl ketone, formic acid and ethyl acetate.

21. The process of claim 13, wherein said arced plasma is high temperature plasma.

22. The process of claim 13 wherein said arced plasma is quasi-high temperature plasma.

* * * * *